United States Patent
Xing et al.

(10) Patent No.: US 11,081,553 B2
(45) Date of Patent: Aug. 3, 2021

(54) METHOD OF FORMING SPLIT GATE MEMORY CELLS

(71) Applicant: Silicon Storage Technology, Inc., San Jose, CA (US)

(72) Inventors: Leo Xing, Shanghai (CN); Chunming Wang, Shanghai (CN); Guo Yong Liu, Shanghai (CN); Melvin Diao, Shanghai (CN); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/868,143

(22) Filed: May 6, 2020

(65) Prior Publication Data

US 2021/0005725 A1    Jan. 7, 2021

(30) Foreign Application Priority Data

Jul. 2, 2019 (CN) .......................... 201910588914.7

(51) Int. Cl.
*H01L 21/00* (2006.01)
*H01L 21/28* (2006.01)
(Continued)

(52) U.S. Cl.
CPC .. *H01L 29/40114* (2019.08); *H01L 21/02244* (2013.01); *H01L 21/26513* (2013.01);
(Continued)

(58) Field of Classification Search
CPC ......... H01L 29/40114; H01L 21/02244; H01L 21/26513; H01L 21/32133;
(Continued)

(56) References Cited

U.S. PATENT DOCUMENTS

| 5,029,130 A | 7/1991 | Yeh |
| 9,018,690 B2 | 4/2015 | Tadayoni et al. |

(Continued)

FOREIGN PATENT DOCUMENTS

| EP | 1 087 443 | 3/2001 |
| EP | 1 191 586 | 3/2002 |
| TW | 200701442 A | 1/2007 |

OTHER PUBLICATIONS

List of References cited in the Notice of Allowance in connection with the related Taiwanese Patent Application No. 109121766 dated May 14, 2021.

*Primary Examiner* — Richard A Booth
(74) *Attorney, Agent, or Firm* — DLA Piper LLP (US)

(57) ABSTRACT

A method of forming a memory device includes forming a second insulation layer on a first conductive layer formed on a first insulation layer formed on semiconductor substrate. A trench is formed into the second insulation layer extending down and exposing a portion of the first conductive layer, which is etched or oxidized to have a concave upper surface. Two insulation spacers are formed along sidewalls of the trench, having inner surfaces facing each other and outer surfaces facing away from each other. A source region is formed in the substrate between the insulation spacers. The second insulation layer and portions of the first conductive layer are removed to form floating gates under the insulation spacers. A third insulation layer is formed on side surfaces of the floating gates. Two conductive spacers are formed along the outer surfaces. Drain regions are formed in the substrate adjacent the conductive spacers.

11 Claims, 13 Drawing Sheets

(51) Int. Cl.
   *H01L 27/11521* (2017.01)
   *H01L 27/11531* (2017.01)
   *H01L 29/423* (2006.01)
   *H01L 21/265* (2006.01)
   *H01L 29/66* (2006.01)
   *H01L 21/02* (2006.01)
   *H01L 21/3213* (2006.01)
   *H01L 29/788* (2006.01)

(52) U.S. Cl.
   CPC .. *H01L 21/32133* (2013.01); *H01L 27/11521* (2013.01); *H01L 27/11531* (2013.01); *H01L 29/42324* (2013.01); *H01L 29/66825* (2013.01); *H01L 29/7883* (2013.01)

(58) Field of Classification Search
   CPC ......... H01L 27/11521; H01L 27/11531; H01L 29/42324; H01L 29/66825; H01L 29/7883
   See application file for complete search history.

(56) References Cited

U.S. PATENT DOCUMENTS

| | | | |
|---|---|---|---|
| 9,570,592 | B2 | 2/2017 | Do et al. |
| 9,721,958 | B2 | 8/2017 | Yang et al. |
| 9,966,380 | B1 * | 5/2018 | Bo ................... H01L 27/11521 |
| 9,972,493 | B2 | 5/2018 | Su et al. |
| 10,418,451 | B1 | 9/2019 | Do et al. |
| 2005/0112821 | A1 | 5/2005 | Kim |
| 2007/0228444 | A1 | 10/2007 | Nakata |
| 2008/0242026 | A1 | 10/2008 | Matsuzaki |
| 2017/0062447 | A1 | 3/2017 | Mukai |
| 2017/0330949 | A1 * | 11/2017 | Wang ................ H01L 27/11521 |
| 2021/0005724 | A1 * | 1/2021 | Wang ................ H01L 29/42328 |

* cited by examiner

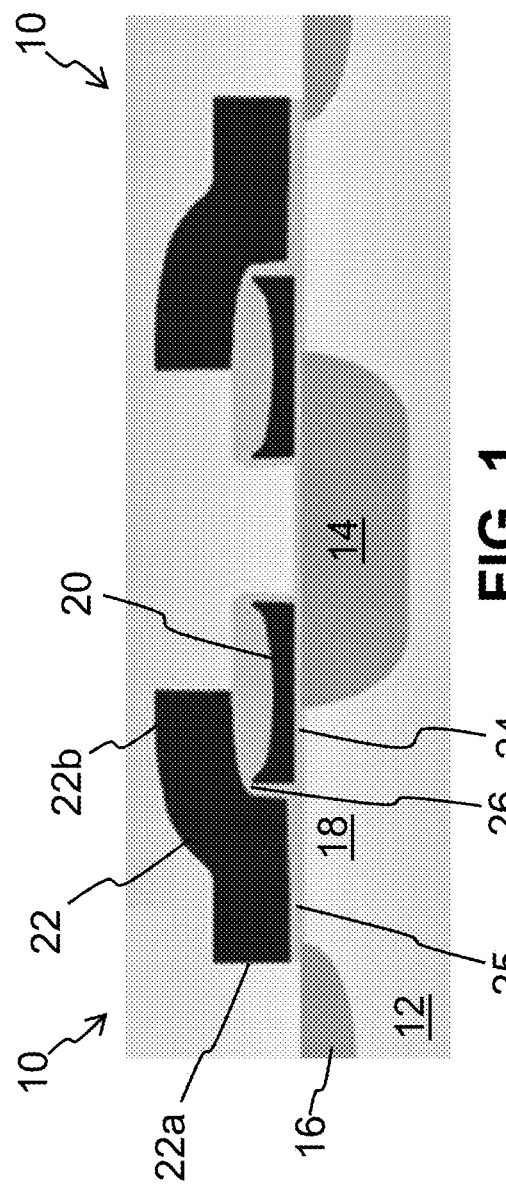

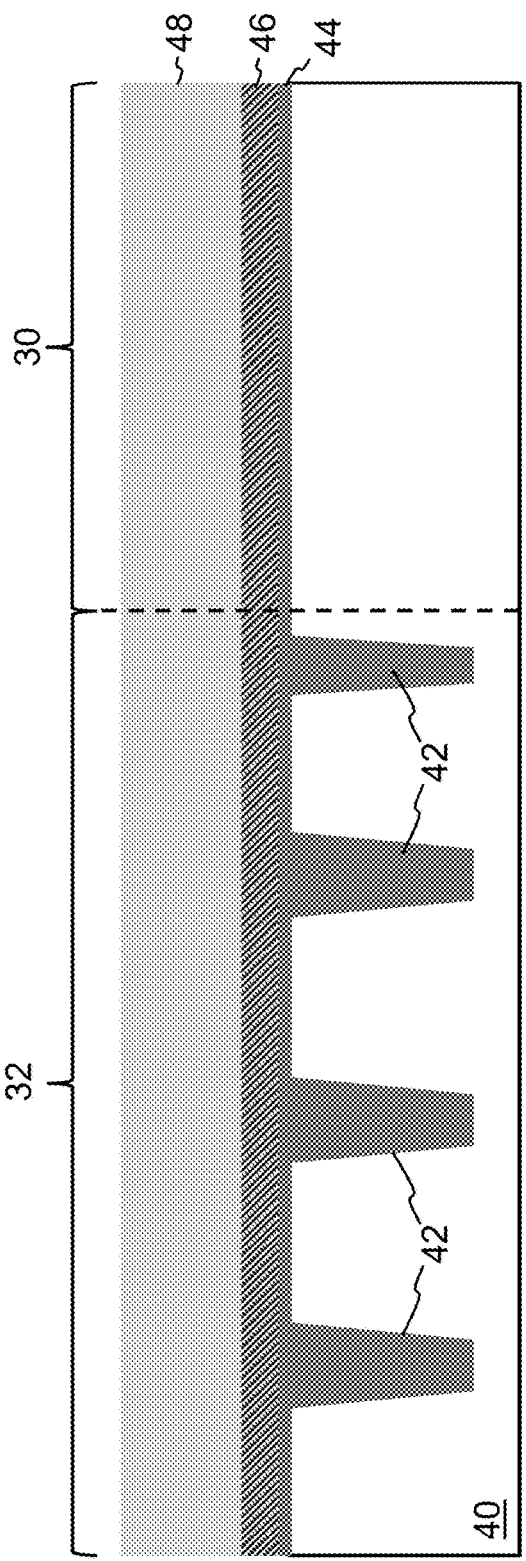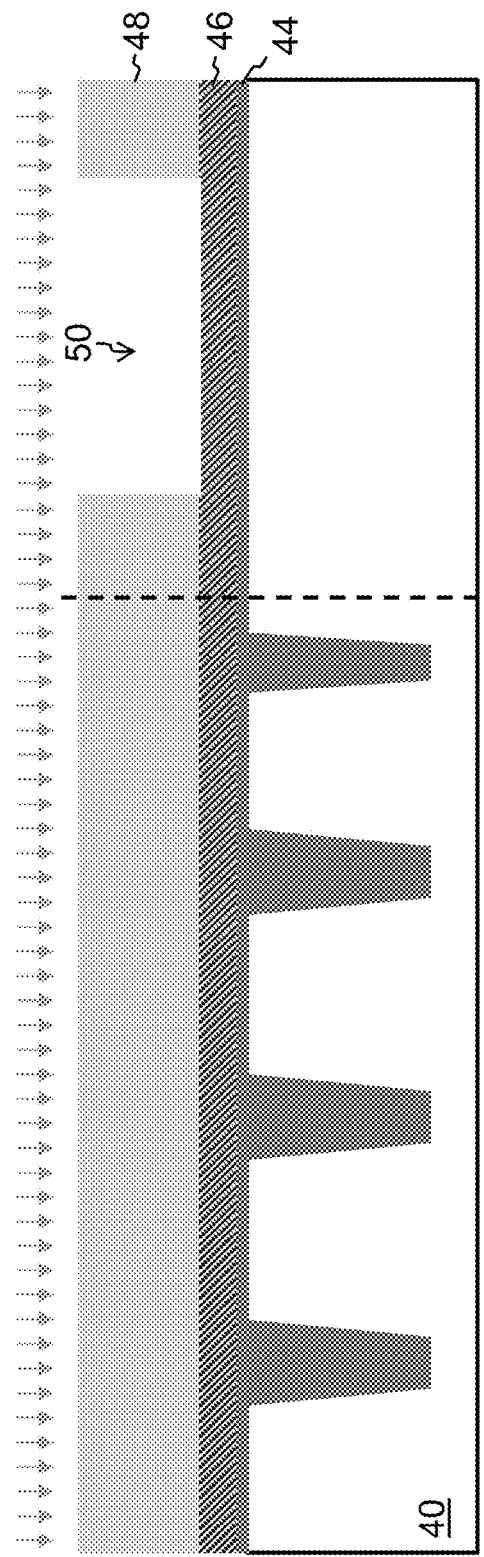

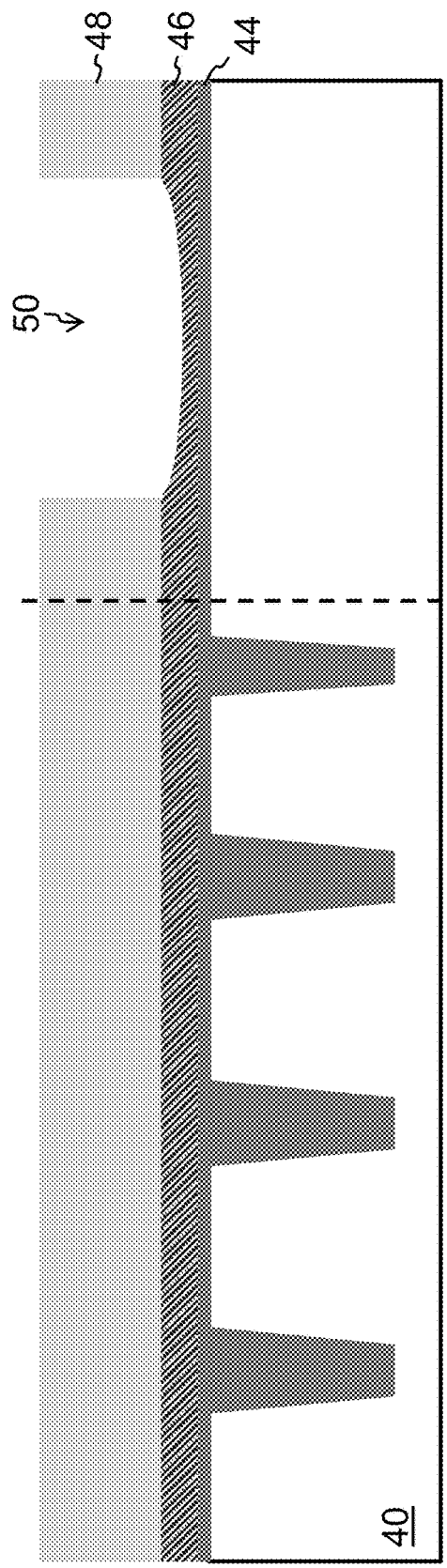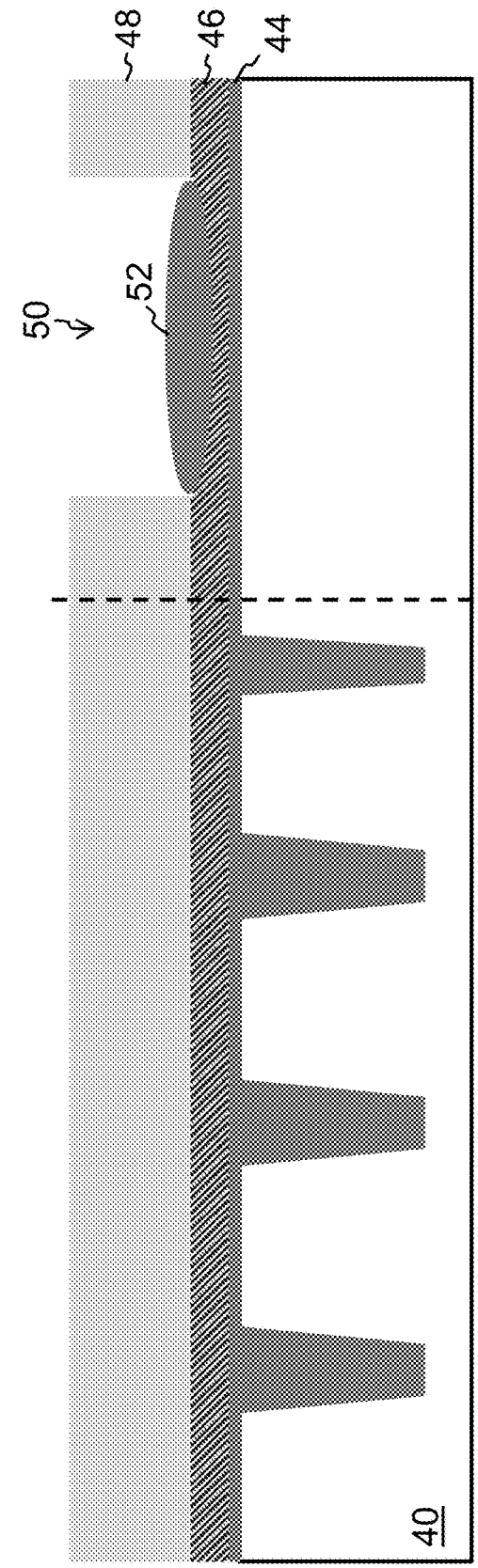

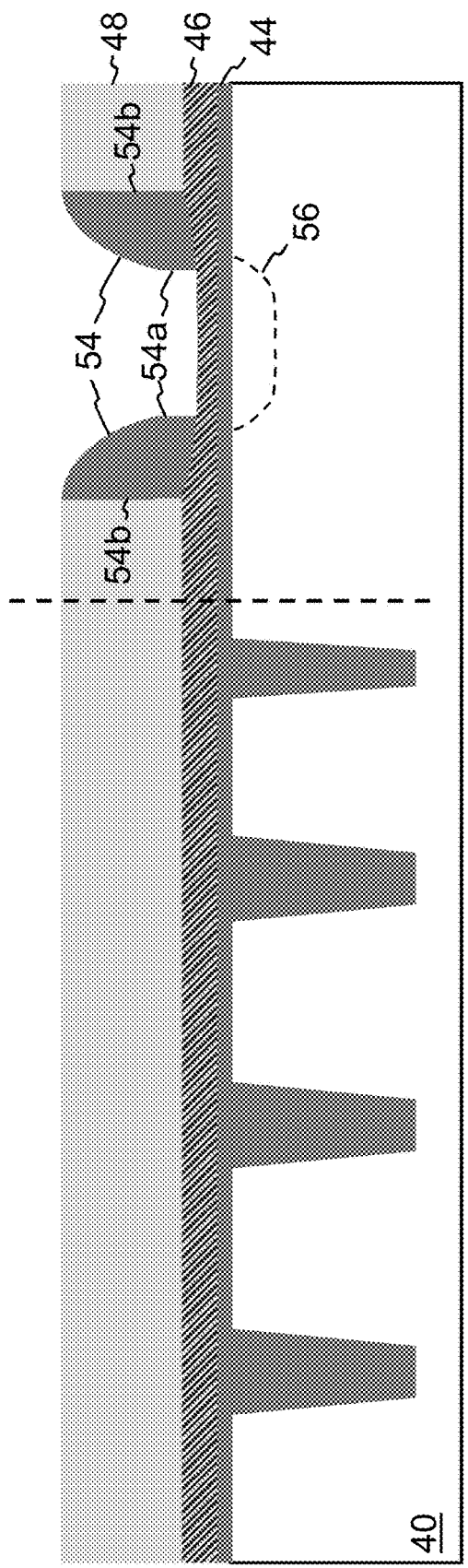
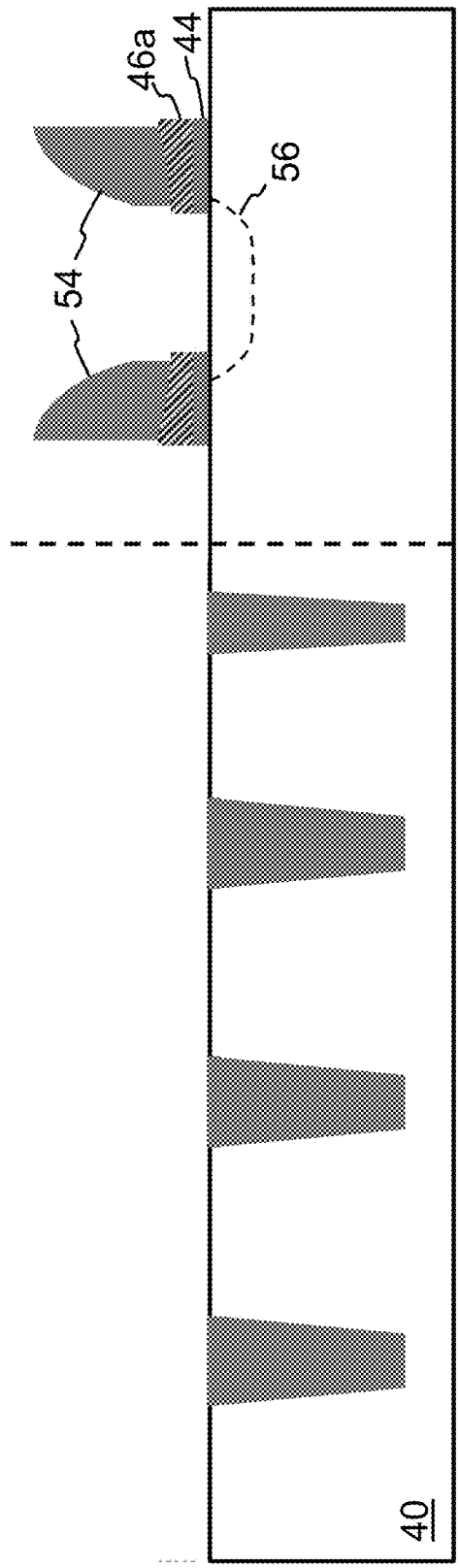

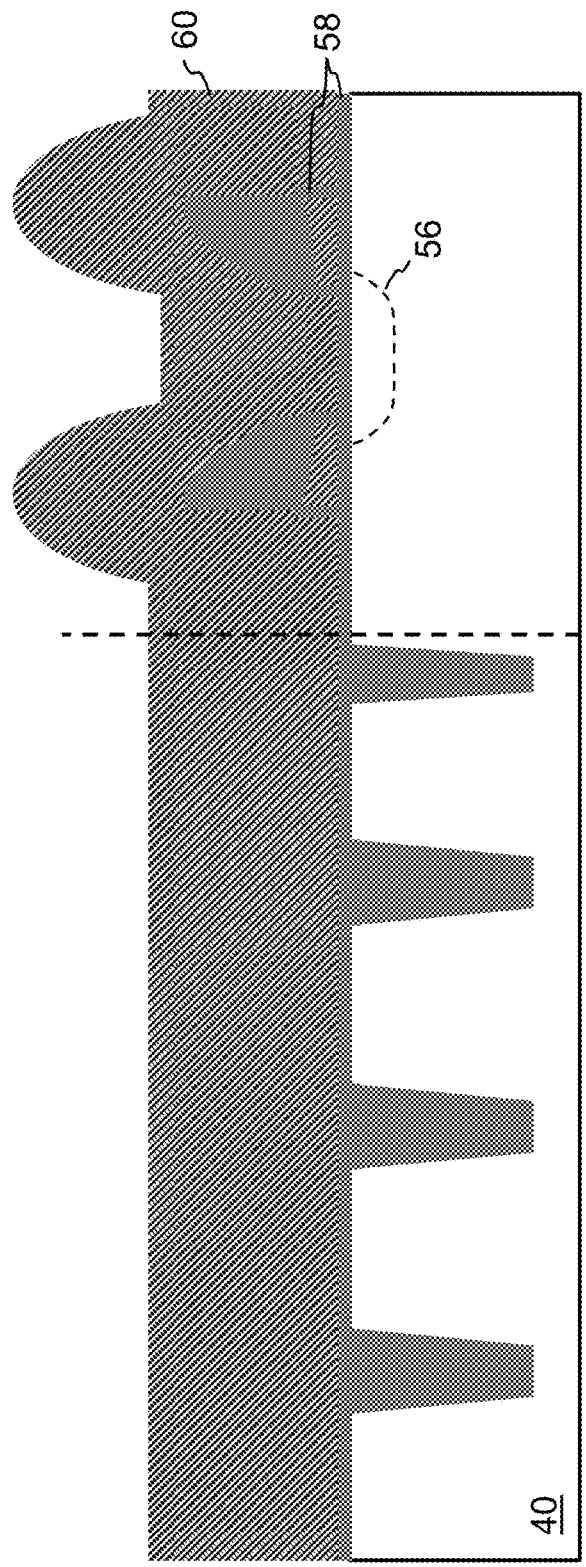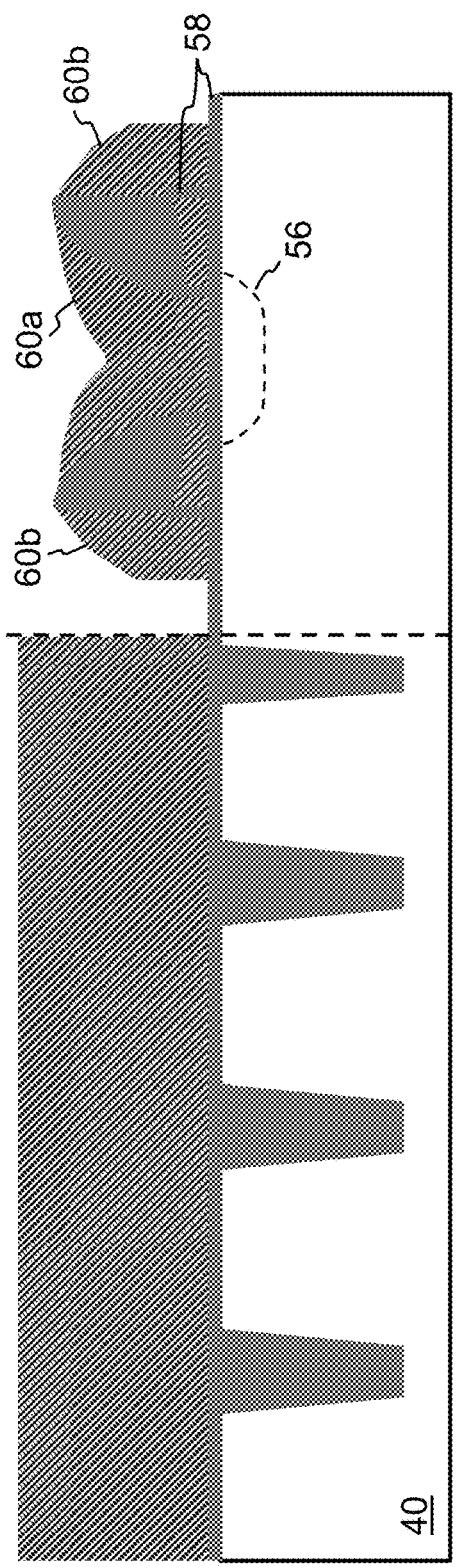

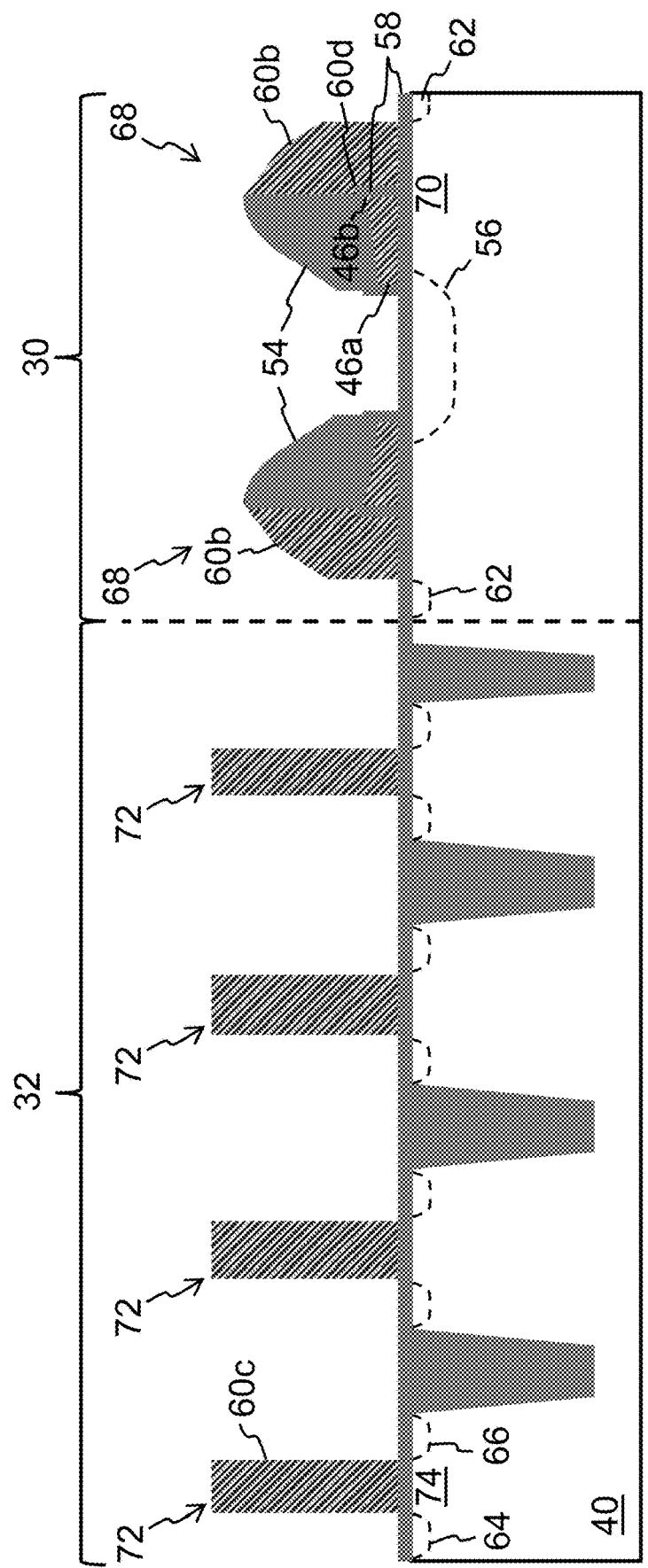

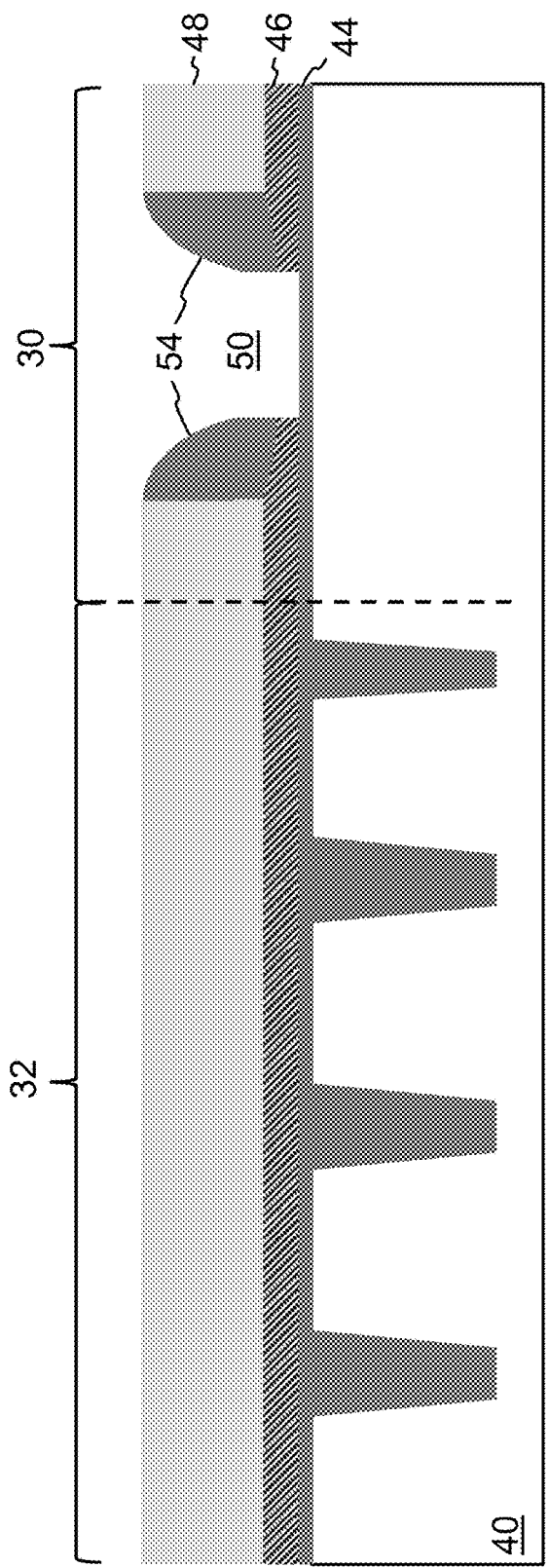
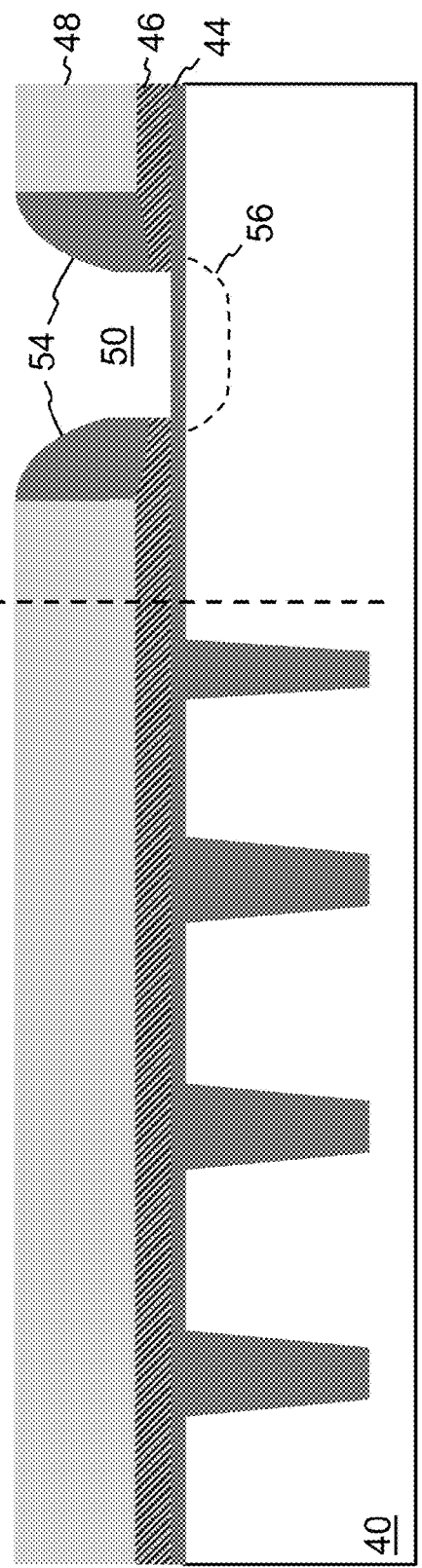

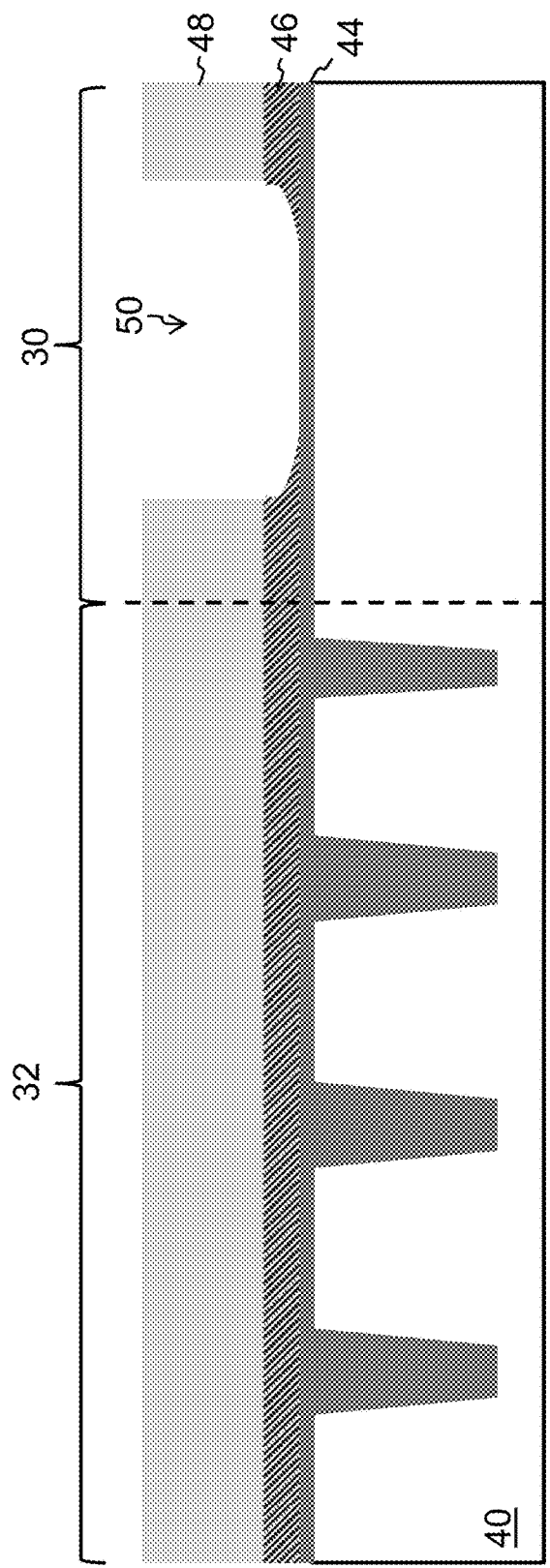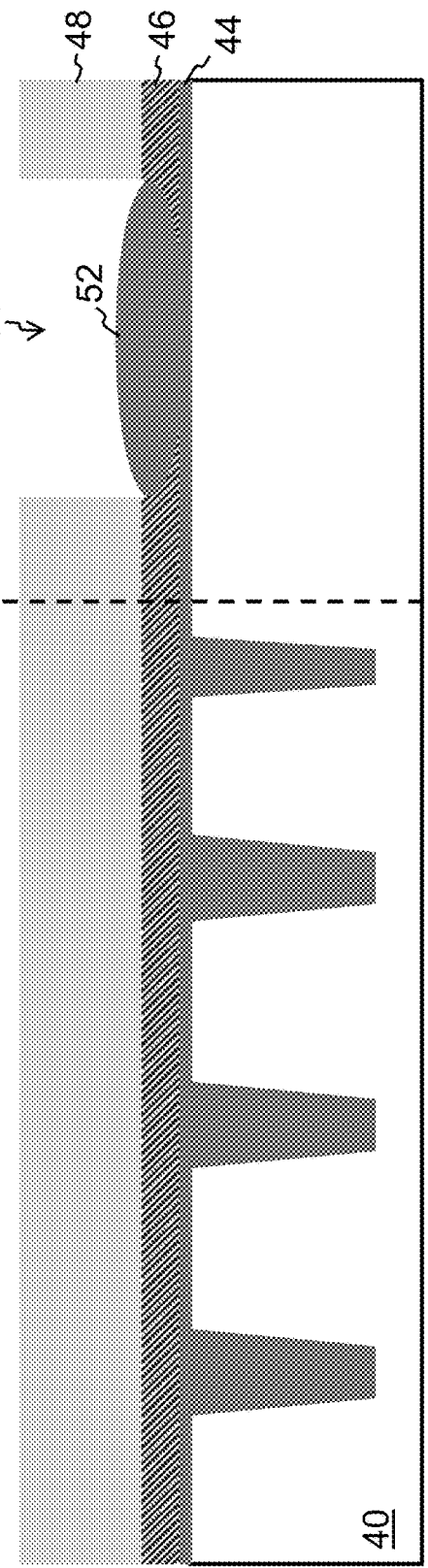

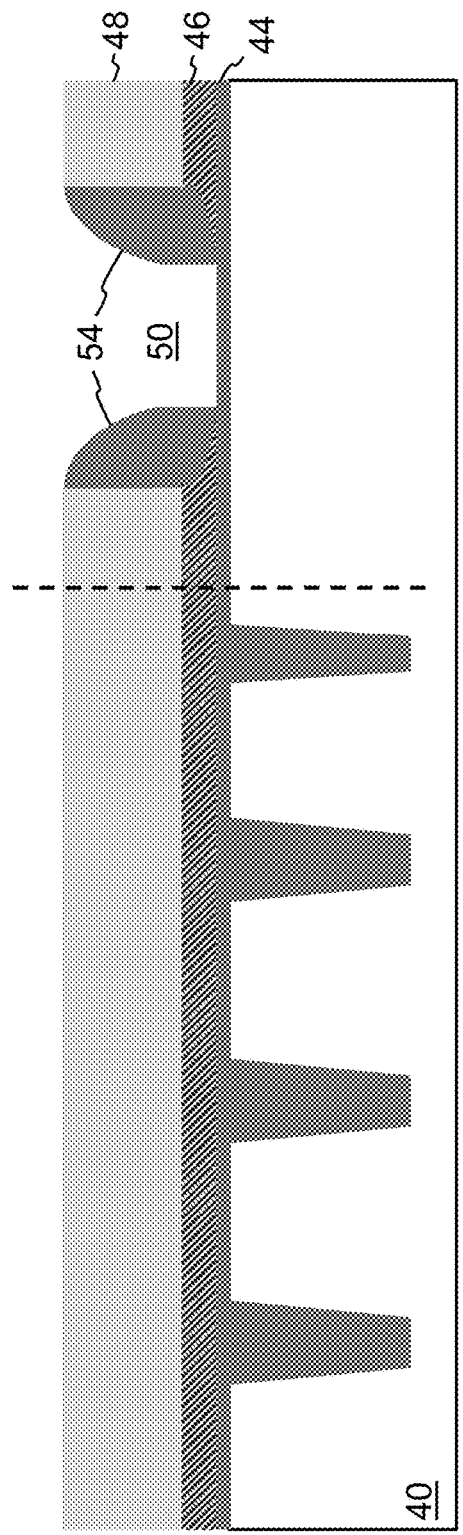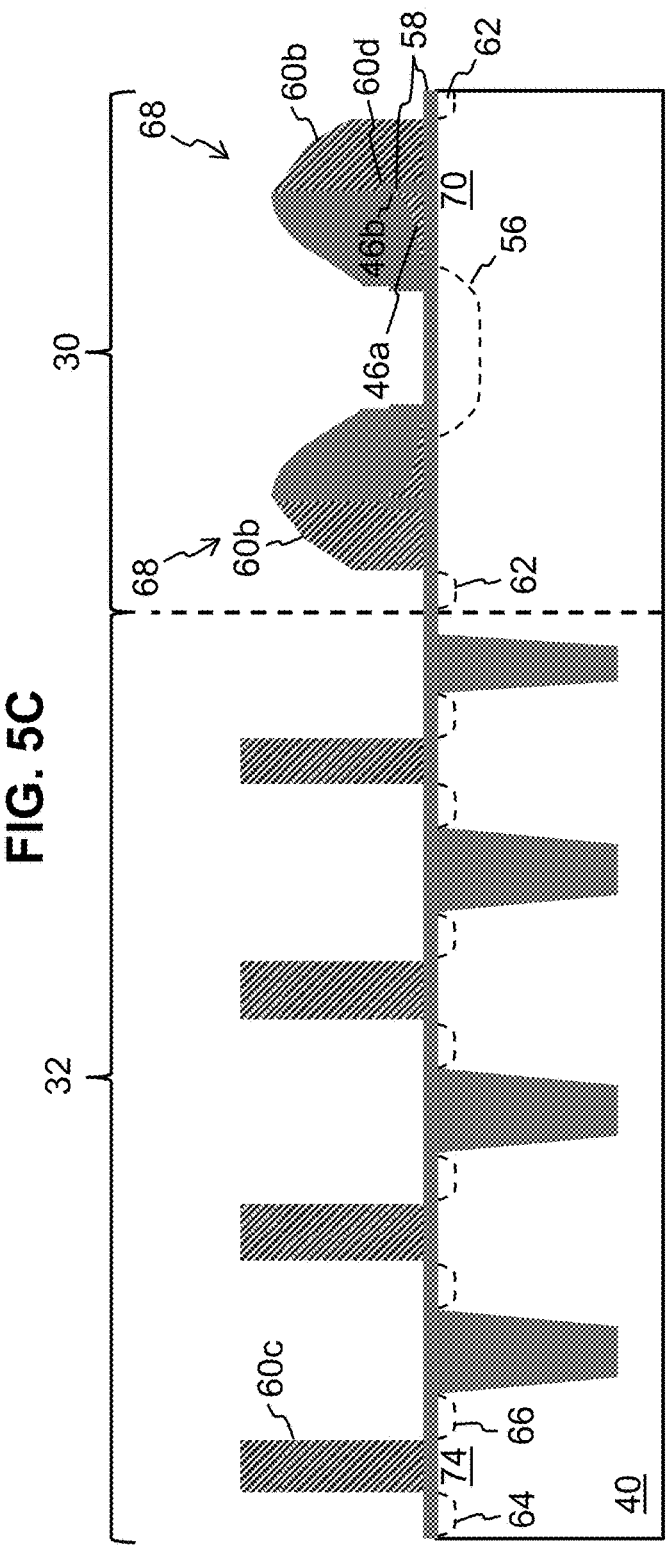

METHOD OF FORMING SPLIT GATE MEMORY CELLS

RELATED APPLICATION

This application claims the benefit of Chinese Patent Application No. 201910588914.7, filed on Jul. 9, 2019.

FIELD OF INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. A pair of prior art split gate memory cells 10 are shown in FIG. 1. Each memory cell 10 includes source and drain regions 14/16 formed in a semiconductor substrate 12, with a channel region 18 there between. The pair of memory cells 10 shares common source region 14. A floating gate 20 is formed over and insulated from (and controls the conductivity of) a first portion of the channel region 18, and over a portion of the source region 14. A control gate 22 has a first portion 22a that is disposed over and insulated from (and controls the conductivity of) a second portion of the channel region 18, and a second portion 22b that extends up and over the floating gate 20. The floating gate 20 is insulated from the substrate 12 by an oxide layer 24 and the control gate 22 is insulated from the substrate by an oxide layer 25.

The memory cell 10 is erased (where electrons are removed from the floating gate) by placing a high positive voltage on the control gate 22, which causes electrons on the floating gate 20 to tunnel through an intermediate insulation 26 (e.g., tunnel oxide) from the floating gate 20 to the control gate 22 via Fowler-Nordheim tunneling.

The memory cell 10 is programmed (where electrons are placed on the floating gate) by placing a positive voltage on the control gate 22, and a positive voltage on the source region 14. Electron current will flow from the drain region 16 towards the source region 14. The electrons will accelerate and become heated when they reach the gap between the control gate 22 and the floating gate 20. Some of the heated electrons will be injected through the oxide 24 onto the floating gate 20 due to the attractive electrostatic force from the floating gate 20.

The memory cell 10 is read by placing positive read voltages on the source region 14 and control gate 22 (which turns on the channel region 18 under the control gate). If the floating gate 20 is positively charged (i.e. erased of electrons and capacitively coupled to the positive voltage on the source region 14), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region 18 under the floating gate 20 is mostly or entirely turned off, and current will not flow (or there will be little flow) across the channel region 18, which is sensed as the programmed or "0" state.

As the above split gate memory cell 10 is scaled down in size, it becomes more challenging to reliably and uniformly manufacture the various cell components. For example, misalignment of components can cause manufacturing issues such as channel length variances among the memory cells (e.g., one memory cell in each memory cell pair can have a longer channel region 18, or wider control gate 22, than that of the other memory cell). This can result in performance variances between the even cells and odd cells of the memory array. Further, scaling down in size can require additional masking steps to achieve the desired memory cell component dimensions and shapes. It can be further challenging to form smaller split gate memory cells on the same substrate on which logic devices are also formed. There is a need for an improved method of forming split gate memory cells that is better conducive to scaling the memory cells down in size and is performed concurrently with the forming of logic devices on the same substrate.

BRIEF SUMMARY OF THE INVENTION

The aforementioned problems and needs are addressed by a method of forming a memory device that includes:
  forming a first insulation layer on an upper surface of a semiconductor substrate;
  forming a first conductive layer on the first insulation layer;
  forming a second insulation layer on the first conductive layer;
  forming a trench into the second insulation layer that extends down to and exposes a portion of the first conductive layer;
  etching or oxidizing the exposed portion of the first conductive layer such that the exposed portion has a concave upper surface;
  forming first and second insulation spacers along sidewalls of the trench and over respective portions of the concave upper surface, wherein the first and second insulation spacers have inner surfaces that face each other and outer surfaces that face away from each other;
  forming a source region in a portion of the substrate below and between the first and second insulation spacers;
  removing the second insulation layer;
  removing portions of the first conductive layer to form a first block of the first conductive layer under the first insulation spacer and a second block of the first conductive layer under the second insulation spacer;
  forming a third insulation layer on side surfaces of the first and second blocks of the first conductive layer;
  forming a first conductive spacer along the outer surface of the first insulation spacer, and a second conductive spacer along the outer surface of the second insulation spacer;
  forming a first drain region in the substrate and adjacent to the first conductive spacer and a second drain region in the substrate and adjacent to the second conductive spacer.

Other objects and features of the present invention will become apparent by a review of the specification, claims and appended figures.

BRIEF DESCRIPTION OF THE DRAWINGS

FIG. 1 is a side cross sectional view of a conventional split gate memory cell.

FIGS. 2A-2I are side cross sectional views showing the steps in forming a memory device with split gate memory cells and logic devices.

FIGS. 4A-4E are side cross sectional views showing the steps in an alternate embodiment for forming a memory device with split gate memory cells and logic devices.

FIGS. 5A-5E are side cross sectional views showing the steps in a second alternate embodiment for forming a memory device with split gate memory cells and logic devices.

DETAILED DESCRIPTION OF THE INVENTION

Figure 3:
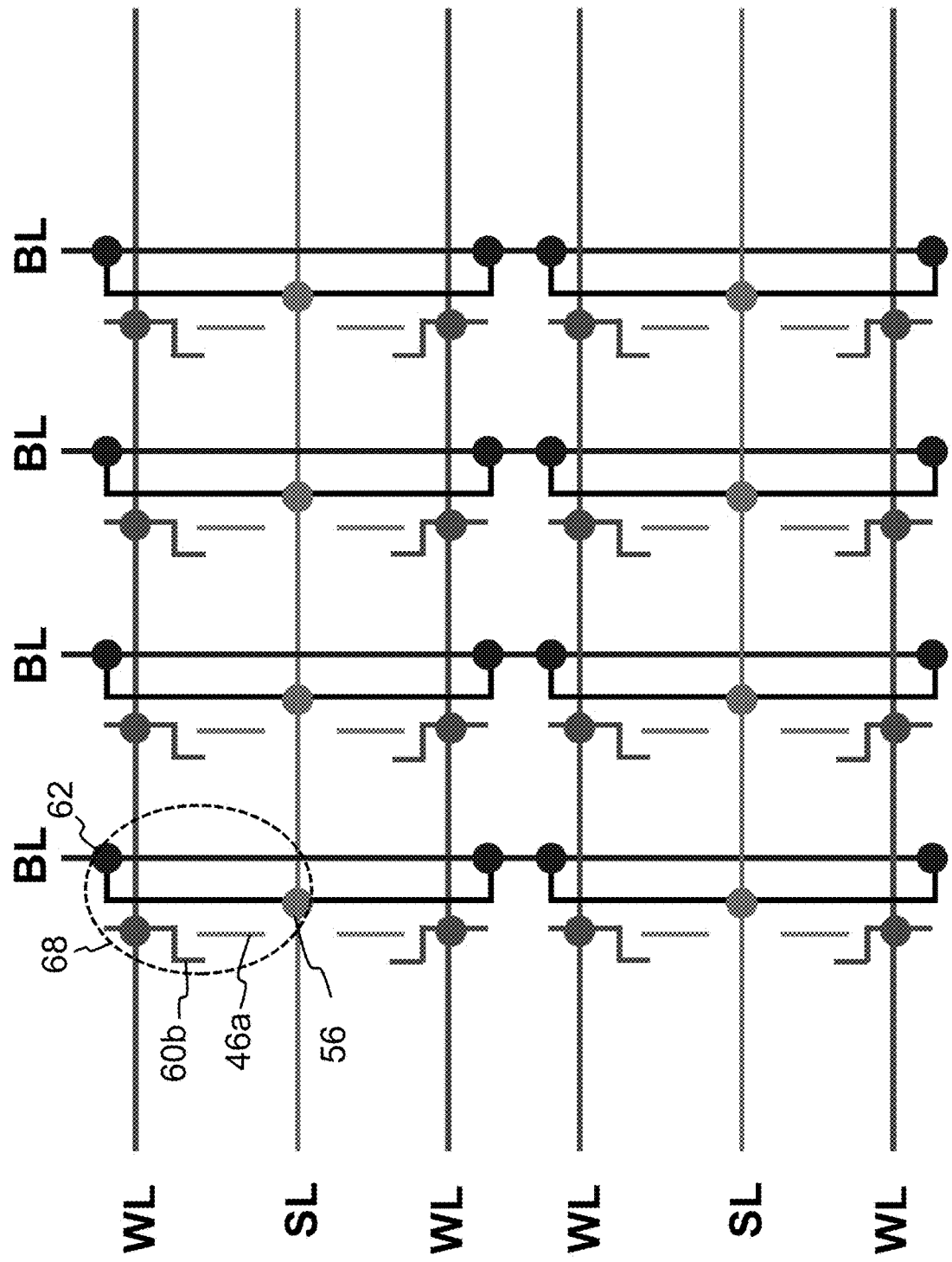
FIG. 3 is a schematic diagram showing the layout of an array of the split gate memory cells.

The present invention involves a new technique for making split gate memory cells on a substrate on which logic devices are also formed. FIGS. 2A-2I show the formation of the memory cells in the memory area 30 of the substrate and logic devices in the logic area 32 of the substrate. The technique begins by forming shallow trench isolation (STI) regions 42 in a semiconductor substrate 40, which is well known in the art. STI regions 42 are formed by forming trenches into the substrate 40, and filling the trenches with an insulation material such a silicon dioxide (hereinafter referred to as "oxide"). The memory cell area 30 is insulated from the logic area 32 by an STI region 42 (e.g., the STI region 42 at the right edge of the logic area 32 in FIG. 2A). The logic area 32 can include additional STI regions 42 separating different regions of the logic area 32 from each other, such as P type regions versus N type regions, low voltage logic devices versus high voltage logic devices, without limitation. Parallel strips of STI regions 42 can also be formed in the memory area 30, to define active areas of the substrate 40 there between in which columns of memory cells are formed. After STI formation, an insulation layer 44 such as silicon dioxide (referred to herein as "oxide" or "oxide layer") is formed on the substrate surface, a conductive layer 46 such as polysilicon is formed on oxide layer 44, and another insulation layer 48 such as silicon nitride (referred to herein as "nitride") is formed on the polysilicon layer 46. The resulting structure is shown in FIG. 2A. While the forgoing description and drawings describe and show the formation of a single pair of memory cells in the memory area 30 and single logic devices between the STI regions 42 in the logic area 32, it should be appreciated that many such devices are being fabricated simultaneously.

A photolithographic masking step is performed, in which a photo resist layer is formed over the structure and selectively exposed, and a selective portion of the photo resist layer is removed, leaving a selective portion of the nitride layer 48 in the memory area 30 exposed. A nitride etch is performed to form a trench 50 into the exposed portion of the nitride layer 48. Trench 50 extends down to and exposes a portion of the polysilicon layer 46. After photo resist removal, the exposed portion of polysilicon layer 46 is then subjected to a material implantation, as shown in FIG. 2B.

The exposed surface of polysilicon layer 46 at the bottom of trench 50 is then made concave by performing a polysilicon etch which removes more of the polysilicon layer at the center of the trench 50 than adjacent the sides of the trench 50, whereby the surface of polysilicon layer 46 slopes upwardly toward the sidewalls of trench 50, as shown in FIG. 2C. Alternately, the concave shape of the upper surface of polysilicon layer 46 at the bottom of trench 50 can be achieved by performing an oxidation step to form oxide 52, whereby the oxidation process consumes more of the polysilicon 46 at the center of the trench 50 than adjacent the sides of the trench 50, as shown in FIG. 2D. Opposing and spaced apart oxide spacers 54 are then formed along the sidewalls of trench 50 by oxide deposition and anisotropic oxide etch. Spacers 54 are thus formed over respective portions of the concave shaped exposed surface of polysilicon layer 46. Formation of spacers is well known in the art by depositing a material over the contour of a structure, followed by an anisotropic etch process, whereby the material is removed from horizontal surfaces of the structure, while the material remains largely intact along vertically oriented surfaces of the structure. An implantation is then performed to form source region 56 in the substrate 40 between oxide spacers 54. The implantation alone, or in combination with an anneal, causes the source region 56 to extend partially underneath spacers 54. The resulting structure is shown in FIG. 2E.

A nitride etch is then used to remove nitrite 48. A polysilicon etch is then used to remove the exposed portions of polysilicon layer 46 (except for those blocks of the polysilicon layer 46a under spacers 54). As a result of this etch, the inner surfaces 54a of the oxide spacers 54 (i.e., those surfaces facing each other) and the outer surfaces 54b of the oxide spacers 54 (i.e., those surfaces facing away from each other) define the length of the remaining blocks 46a of polysilicon layer 46, which form floating gates 46a that remain under the oxide spacers 54. An oxide etch is then performed to remove the exposed portions of oxide layer 44 (except for those portions under spacers 54). The oxide etch also thins the oxide spacers 54 by removing a small amount of the inner and outer surfaces 54a and 54b, leaving end portions of the floating gates 46a exposed. The resulting structure is shown in FIG. 2F. An insulation layer 58 preferably of oxide is formed over the structure, including on the exposed surface portions of the substrate 40 and the exposed ends of floating gates 46a. A relatively thick conductive layer 60 preferably of polysilicon is then formed on oxide layer 58, as shown in FIG. 2G. A masking step is performed to cover the logic area 32 with photo resist but leaving the memory area 30 exposed. A polysilicon etch is then performed to remove upper portions of the polysilicon layer 60, leaving polysilicon block 60a between the oxide spacers 54, and conductive polysilicon spacers 60b on the outer sides of oxide spacers 54, as shown in FIG. 2H (after photo resist removal) (i.e., polysilicon block 60a is separated from polysilicon spacers 60b by oxide spacers 54).

A masking step is performed to cover the memory area 30 with photo resist except for polysilicon block 60a, and cover portions of the logic area 32 with photo resist but leaving portions of the polysilicon layer 60 between the STI regions 42 in the logic area exposed. A polysilicon etch is then performed to remove polysilicon block 60a from the memory area 30, and to remove the exposed portions of polysilicon layer 60 in the logic area 32, leaving polysilicon blocks 60c remaining in the logic area 32. An implantation is then performed to form drain regions 62 in the memory area 30 of the substrate 40 adjacent the polysilicon spacers 60b, and source and drain regions 64, 66 in the logic area 32 of the substrate 40 adjacent opposite sides of the polysilicon blocks 60c. The source regions 56 can be protected from this implantation by photo resist, or left exposed and enhanced by this implantation. The resulting structure is shown in FIG. 2I.

In the memory area 30, pairs of memory cells 68 have now been formed end to end. Each memory cell 68 includes a source region 56 and a drain region 62, with a channel region of the substrate 70 extending there between. A floating gate 46a is disposed over and insulated from a first portion of the channel region 70 (to control its conductivity) and is partially over and insulated from the source region 56, and a control gate 60b in the form of a polysilicon spacer is disposed over and insulated from a second portion of the channel region 70 (to control its conductivity). The floating gate 46a has a sloping upper surface terminating in a sharp edge 46b, which faces a notch 60d of the control gate 60b (for enhanced erase efficiency through intervening insulation layer 58. Each memory cell pair shares a common source region 56, and adjacent pairs of memory cells can share common drain regions 62. The pairs of memory cells are arranged end to end in columns, to form an array of memory cells arranged in rows and columns. The layout of the memory array is illustrated schematically in FIG. 3. Each word line WL electrically connects together all the control gates 60b in one of the rows of memory cells 68. Each source line SL electrically connects together all the source regions 56 in one of the rows of memory cell pairs. Each bit line BL electrically connects together all the drain regions 62 in one of the columns of memory cells 68.

In the logic area 32, logic devices 72 are formed. Each logic device includes a source region 64 and a drain region 66, with a channel region of the substrate 74 extending there between. A logic gate 60c is disposed over and insulated from the channel region 74 to control its conductivity.

The method of forming the structure of FIG. 2I has many advantages. Oxide spacers 54, as shown in FIGS. 2E-2I, are formed to dictate the location and size of each floating gate 46a (overall length of the floating gate 46a over the channel region is dictated by oxide spacer 54). The polysilicon layer 46 is etched away on both sides of the oxide spacers 54 at the same time using the same polysilicon etch to form floating gate 46a. The width of the oxide spacers 54 is reduced with a common oxide etch, which dictates a uniform size of the floating gates 46a, as well as the control gate notch 60d facing the floating gate sharp edge 46b. The oxide layer 58 insulating the floating gate sharp edge 46b and the control gate notch 60d is also the same layer that insulates the control gates 60b and logic gates 60c from the substrate 40. The control gates 60b are formed as spacers using a common polysilicon etch, ensuring uniform length. The same polysilicon etch is used to form the logic gates 60c and to remove the polysilicon block 60a over the source region 56. The floating gate 46a has a sloping upper surface terminating in a sharp edge facing the control gate 60b, to enhance erase performance. The logic source and drain regions 64/66 and the memory cell drain regions 62 can be formed using a common implantation. This combination of features and advantages provides better control on the uniformity of floating gate to floating gate spacing, the length of the channel regions 70, the respective lengths of floating gate 46a and the control gate 60b over the channel region 70, and the erase efficiency among the various memory cells 68. The method can also be implemented with fewer masking steps and/or processing steps than conventional methods. For example, no separate masking step is necessary to perform the source region implantation for the memory cells 68, where the source region 56 is defined by the spacing between spacers 54.

Figure 4C:
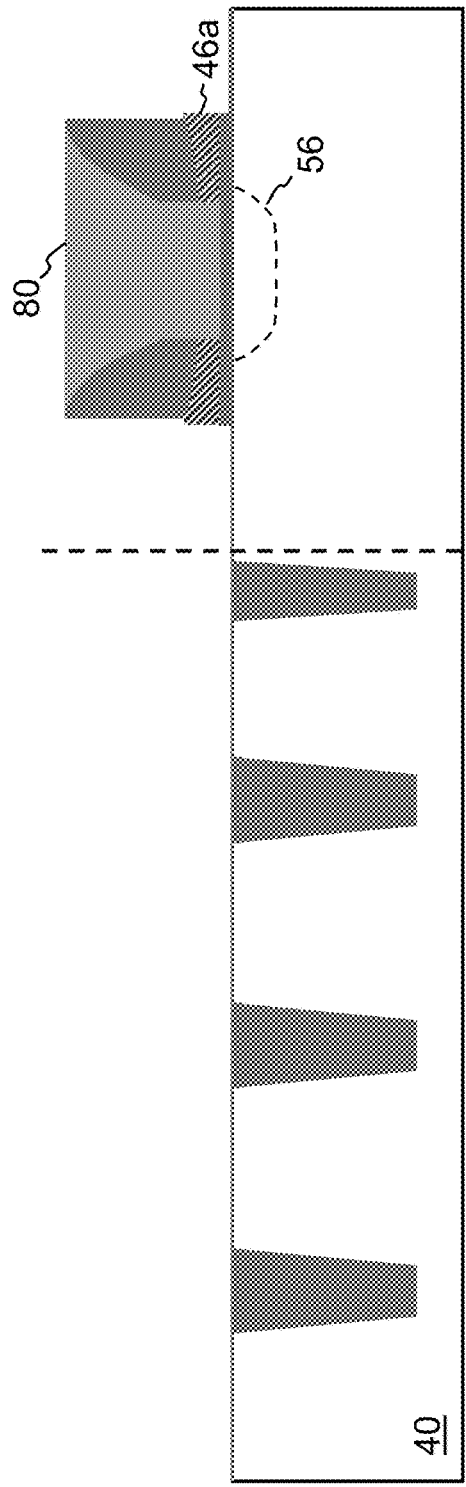
Figure 4D:
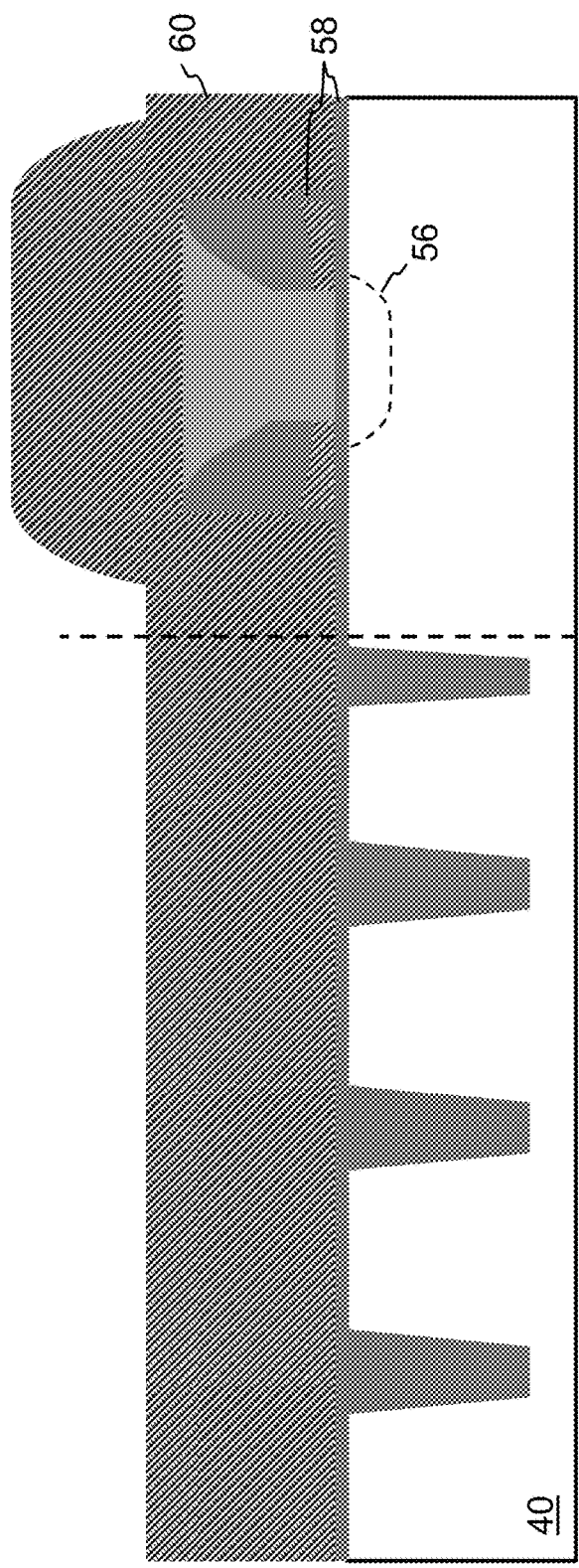
Figure 4E:
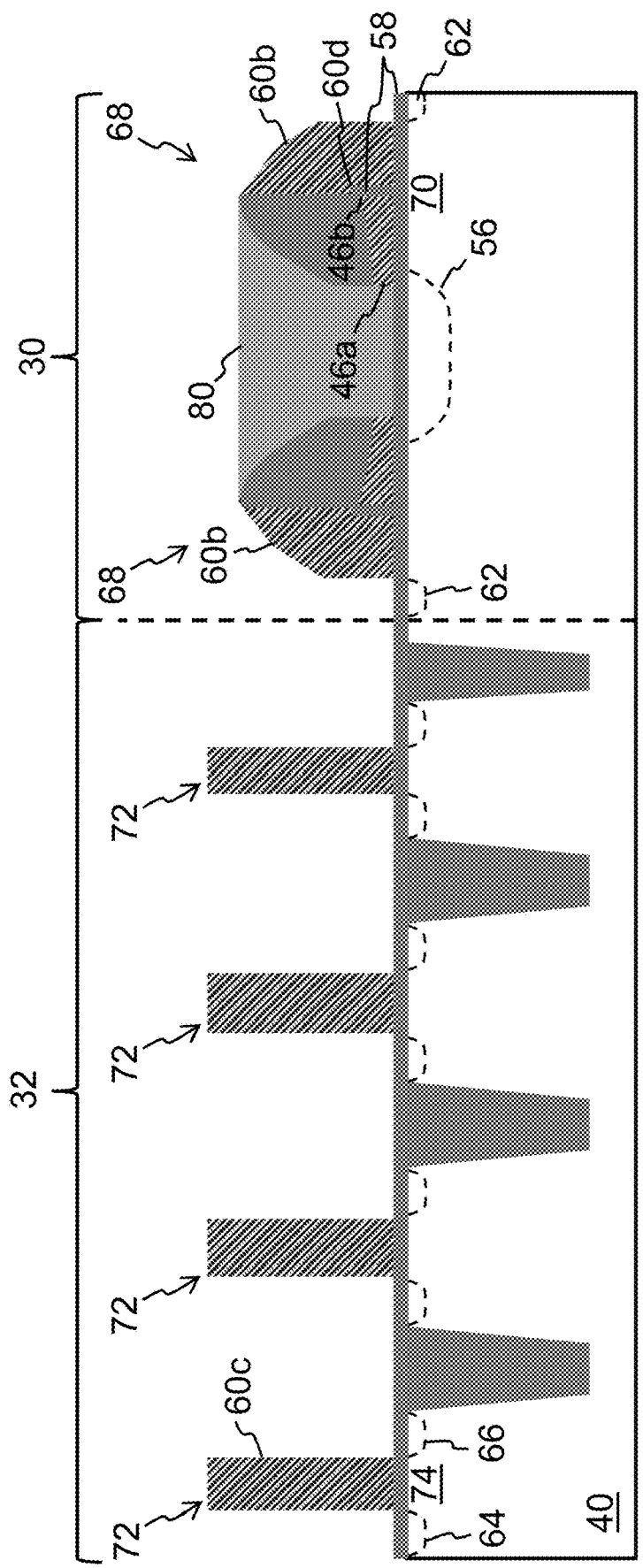

FIGS. 4A-4E illustrate an alternate embodiment for forming the memory cells in the memory area 30 of the substrate and the logic devices in the logic area 32 of the substrate. This embodiment starts with the same structure as FIG. 2C or 2D. Oxide spacers 54 are formed along the sidewalls of trench 50 by oxide deposition and anisotropic oxide etch as described above in relation to FIG. 2E. However, before the source region implant, a polysilicon etch is performed to remove the exposed polysilicon layer from the bottom of trench 50, as shown in FIG. 4A. Then, the implantation is performed to form source region 56 in the substrate between oxide spacers 50, as shown in FIG. 4B. An oxide deposition (TEOS) is then performed to cover the structure in oxide 80, including filling trench 50. An oxide chemical mechanical polish (CMP) and/or oxide etch are performed to remove the oxide 80 covering nitride layer 48, but the oxide 80 remains in trench 50. A nitride etch is then used to remove nitride 48. A polysilicon etch is then used to remove the exposed portions of polysilicon layer 46 (except for those portions under spacers 54). An oxide etch is then performed to remove the exposed portions of oxide layer 44 (except for those portions under spacers 54). The oxide etch also thins the spacers 54, leaving end portions of the polysilicon layer 46 (i.e., ends of floating gates 46a) exposed. The resulting structure is shown in FIG. 4C. Oxide layer 58 is then formed over the structure, including on the exposed ends of floating gates 46a. Thick polysilicon layer 60 is then formed on oxide layer 58, as shown in FIG. 4D. A masking step is performed to cover portions of the logic area 32 with photo resist but leaving portions of the polysilicon layer 60 in the logic area 32 exposed, and leaving the memory area 30 exposed. A polysilicon etch is then performed to remove the exposed portions of polysilicon layer 60 in the logic area, leaving polysilicon blocks 60c remaining in the logic area 32. The same polysilicon etch removes the upper portions of the polysilicon layer 60 in the memory area 30, leaving polysilicon spacers 60b on the outer sides of oxide spacers 54. An implantation is then performed to form drain regions 62 in the memory area 30 of the substrate 40 adjacent the polysilicon spacers 60b, and source and drain regions 64, 66 in the logic area 32 of the substrate 40 adjacent the polysilicon blocks 60c. The resulting structure is shown in FIG. 4E.

The embodiment of FIGS. 4A-4E has several additional advantages. The source region implant for the memory area 30 is made easier by removing the polysilicon layer 46 from the bottom of trench 50 before the implant. The source region implant need only penetrate oxide layer 44. Further, by filling trench 50 with oxide 80, polysilicon 60 is never formed in trench 50, thereby avoiding the need to remove polysilicon 60 from that region later on (thus reducing the risk that residual and unwanted polysilicon could remain in trench 50). Finally, a single polysilicon etch is used to form the control gates 60b (in the form of spacers) and logic gates 60c.

Figure 5E:
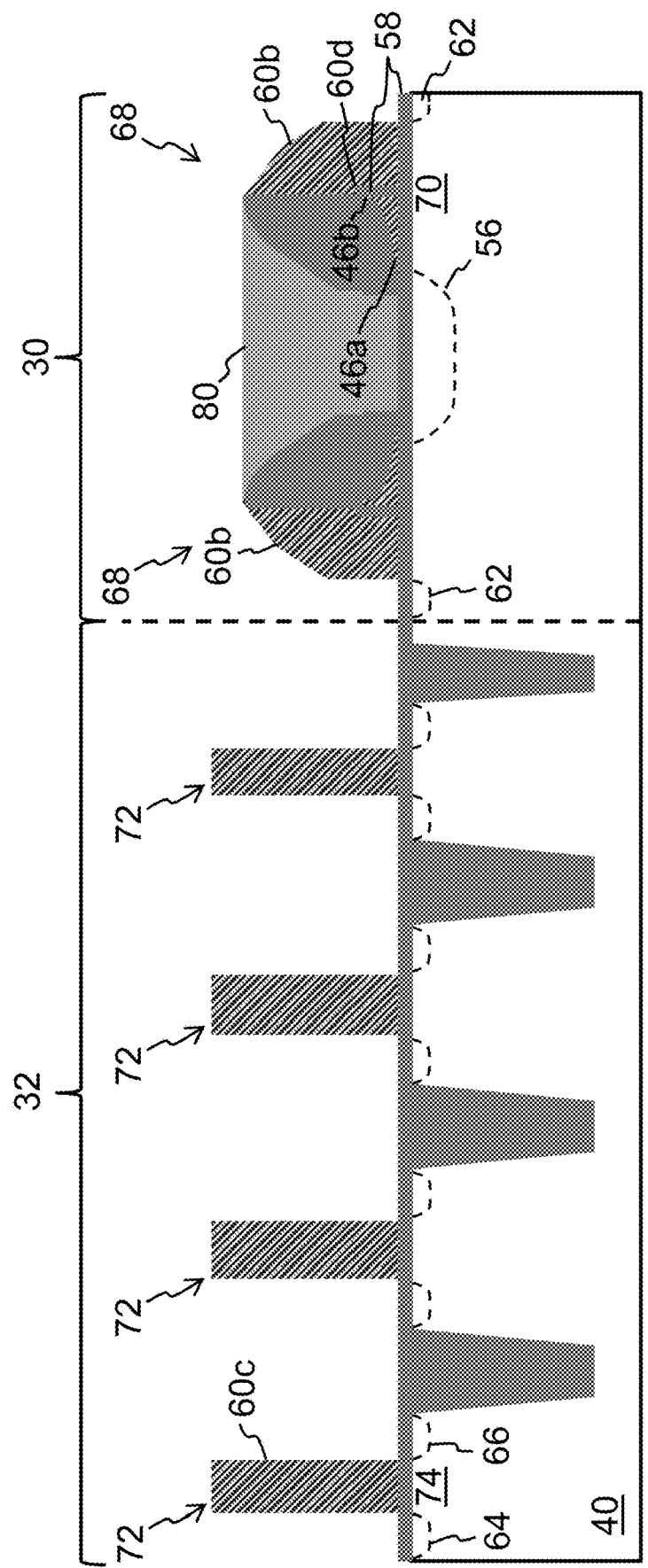

FIGS. 5A-5E illustrate a second alternate embodiment for forming the memory cells in the memory area 30 of the substrate and the logic devices in the logic area 32 of the substrate. This embodiment starts with the same structure as FIG. 2B. The process of making the polysilicon layer 46 at the bottom of the trench concave by polysilicon etch or oxidation as described above with respect to FIG. 2C or 2D is performed more aggressively (i.e., deeper into the bottom of trench 50) so that the entire depth of polysilicon layer 46 at a center portion of trench 50 is entirely removed, as shown in FIGS. 5A and 5B. Then, when spacers 54 are formed in trench 50, there is no portion of polysilicon layer 46 remaining between the spacers 54, as shown in FIG. 5C. The structure of 5C can then be processed with the steps as described above with respect to FIGS. 2E-2I to result in the structure of FIG. 5D. Alternatively, the structure of 5C can then be processed with the steps as described above with respect to FIGS. 4B-4E to result in the structure of FIG. 5E. The advantage of the second alternate embodiment is that the polysilicon 46 at the bottom of trench 50 need not be separately be removed.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the split gate memory cells and logic devices of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
    forming a first insulation layer on an upper surface of a semiconductor substrate;
    forming a first conductive layer on the first insulation layer;
    forming a second insulation layer on the first conductive layer;
    forming a trench into the second insulation layer that extends down to and exposes a portion of the first conductive layer;
    etching or oxidizing the exposed portion of the first conductive layer such that the exposed portion has a concave upper surface;
    forming first and second insulation spacers along sidewalls of the trench and over respective portions of the concave upper surface, wherein the first and second insulation spacers have inner surfaces that face each other and outer surfaces that face away from each other;
    forming a source region in a portion of the substrate below and between the first and second insulation spacers;
    removing the second insulation layer;
    removing portions of the first conductive layer to form a first block of the first conductive layer under the first insulation spacer and a second block of the first conductive layer under the second insulation spacer;
    forming a third insulation layer on side surfaces of the first and second blocks of the first conductive layer;
    forming a first conductive spacer along the outer surface of the first insulation spacer, and a second conductive spacer along the outer surface of the second insulation spacer;
    forming a first drain region in the substrate and adjacent to the first conductive spacer and a second drain region in the substrate and adjacent to the second conductive spacer.

2. The method of claim 1, further comprising:
    before the forming of the third insulation layer, removing portions of the first insulation layer such that a first portion of the first insulation layer remains under the first block of the first conductive layer and a second portion of the first insulation layer remains under the second block of the first conductive layer.

3. The method of claim 2, wherein the forming of the third insulation layer includes forming the third insulation layer directly on portions of the substrate upper surface.

4. The method of claim 3, wherein the first and second conductive spacers are insulated from the substrate by the third insulation layer, and are insulated from the first and second blocks of the first conductive layer by the third insulation layer.

5. The method of claim 1, wherein the forming of the first and second conductive spacers comprises:
    forming a second conductive layer over the substrate; and
    performing an etch on the second conductive layer to remove portions of the second conductive layer, wherein the first and second conductive spacers are remaining spacers of the second conductive layer.

6. The method of claim 5, wherein the forming of the second conductive layer further includes forming the second conductive layer over a logic area of the substrate, and wherein the method further comprises:
    selectively removing portions of the second conductive layer to form a block of the second conductive layer over the logic area of the substrate;
    forming a second source region in the substrate and adjacent to a first side of the block of the second conductive layer;
    forming a third drain region in the substrate and adjacent to second side of the block of the second conductive layer opposite the first side.

7. The method of claim 6, wherein the selectively removing portions of the second conductive layer is performed using the etch on the second conductive layer.

8. The method of claim 1, wherein the forming of the source region comprises:
    performing an implantation where particles are injected into the trench, through the first conductive layer, through the first insulation layer, and into the substrate.

9. The method of claim 1, further comprising:
    before the forming of the source region, removing a portion of the first conductive layer disposed below and between the first and second insulation spacers;
    wherein the forming of the source region comprises performing an implantation where particles are injected into the trench, through the first insulation layer, and into the substrate.

10. The method of claim 1, further comprising:
before the forming of the first and second conductive spacers, forming insulation material in the trench and between the inner surfaces of the first and second insulation spacers.

11. The method of claim 1, wherein the etching or oxidizing the exposed portion of the first conductive layer is performed such that a portion of the first conductive layer at a center of the trench is entirely removed.

\* \* \* \* \*